(12) United States Patent
Petrillo et al.

(10) Patent No.: US 10,373,310 B2
(45) Date of Patent: Aug. 6, 2019

(54) METHOD FOR ANALYZING DATA PROVIDED BY MAGNETIC RESONANCE IMAGING WITH DYNAMIC ADMINISTRATION OF CONTRAST MEDIUM

(71) Applicant: Istituto Nazionale Tumori—Fondazione G. Pascale, Naples (IT)

(72) Inventors: Antonella Petrillo, Naples (IT); Roberta Fusco, Naples (IT)

(73) Assignee: Istituto Nazionale Tumori—Fondazione G. Pascale, Naples (IT)

( * ) Notice: Subject to any disclaimer, the term of this patent is extended or adjusted under 35 U.S.C. 154(b) by 290 days.

(21) Appl. No.: 15/100,311

(22) PCT Filed: Nov. 28, 2014

(86) PCT No.: PCT/IB2014/002592
§ 371 (c)(1),
(2) Date: May 29, 2016

(87) PCT Pub. No.: WO2015/079311
PCT Pub. Date: Jun. 4, 2015

(65) Prior Publication Data
US 2016/0300344 A1 Oct. 13, 2016

(30) Foreign Application Priority Data
Nov. 29, 2013 (IT) .............................. MO2013A0326

(51) Int. Cl.
*G06T 7/00* (2017.01)
*G01R 33/56* (2006.01)

(52) U.S. Cl.
CPC ........ *G06T 7/0012* (2013.01); *G01R 33/5601* (2013.01); *G06T 2207/10088* (2013.01);
(Continued)

(58) Field of Classification Search
CPC ......... G06T 7/0012; G06T 2207/10088; G06T 2207/30028; G06T 2207/30096; G01R 33/5601
(Continued)

(56) References Cited

U.S. PATENT DOCUMENTS

| 7,024,024 | B1 * | 4/2006 | Aiazian | ................. | A61B 8/461 |
| | | | | | 382/128 |
| 2002/0029120 | A1 * | 3/2002 | Degani | ................ | A61B 5/0263 |
| | | | | | 702/100 |

(Continued)

FOREIGN PATENT DOCUMENTS

| WO | WO 01/35339 | 5/2001 |
| WO | WO 2011/146475 | 11/2011 |
| WO | WO 2015/079311 | 6/2015 |

OTHER PUBLICATIONS

Tanner, L. N., Hughes, N. P., Brady, M., Anderson, M., & Gleeson, F. V. (Jun. 2009). Robust estimation of pharmacokinetic parameters in DCE-MRI analysis of rectal tumours. In Biomedical Imaging: From Nano to Macro, 2009. ISBI'09. IEEE International Symposium on (pp. 69-72). IEEE.*

(Continued)

*Primary Examiner* — Michael J Carey
*Assistant Examiner* — Johnathan Maynard

(57) ABSTRACT

Method for analyzing data provided by Magnetic Resonance Imaging with dynamic administration of contrast medium in patients with locally advanced rectal cancer, after neoadjuvant radio-chemotherapy, comprising: making available pre- and post-treatment digital images, having one or more regions of interest identified; splitting the regions of interest into portions; calculating first and second time-intensity curves for each portion of the regions of pre- and post-treatment interest, respectively; calculating the maximum signal difference and gradient of the wash-out section for the (Continued)

curves calculated; calculating the median value of the maximum signal difference and of the gradient calculated; calculating the percentage variation between the median values of the maximum signal difference and of the gradient of the wash-out section calculated for each of the first and second curves; linearly combining percentage variations of the maximum signal difference and of the gradient of the wash-out section, to define a relative linear classification index.

7 Claims, 3 Drawing Sheets

(52) U.S. Cl.
CPC ............... *G06T 2207/30028* (2013.01); *G06T 2207/30096* (2013.01)

(58) Field of Classification Search
USPC ........................................................ 600/420
See application file for complete search history.

(56) References Cited

U.S. PATENT DOCUMENTS

| | | | | |
|---|---|---|---|---|
| 2007/0133852 | A1* | 6/2007 | Collins | A61B 8/08 382/128 |
| 2009/0238428 | A1* | 9/2009 | Shinagawa | G01R 33/56366 382/131 |
| 2010/0305454 | A1* | 12/2010 | Dvorsky | A61B 5/0059 600/476 |
| 2011/0188722 | A1* | 8/2011 | Huang | G01R 33/56 382/131 |
| 2011/0213244 | A1* | 9/2011 | Frinking | A61B 5/055 600/431 |
| 2013/0060135 | A1* | 3/2013 | Frinking | A61B 8/481 600/431 |
| 2014/0039300 | A1* | 2/2014 | Gjesdal | A61B 5/055 600/420 |
| 2014/0163403 | A1* | 6/2014 | Lenox | A61B 5/026 600/504 |

OTHER PUBLICATIONS

Fan, X., Medved, M., Karczmar, G. S., Yang, C., Foxley, S., Arkani, S., . . . & Newstead, G. M. (2007). Diagnosis of suspicious breast lesions using an empirical mathematical model for dynamic contrast-enhanced MRI. Magnetic resonance imaging, 25(5), 593-603.*
El Khouli, R. H., Macura, K. J., Jacobs, M. A., Khalil, T. H., Kamel, I. R., Dwyer, A., & Bluemke, D. A. (2009). Dynamic contrast-enhanced MRI of the breast: quantitative method for kinetic curve type assessment. American Journal of Roentgenology, 193(4), W295-W300.*
Kim, J. W., Kim, H. C., Park, J. W., Park, S. C., Sohn, D. K., Choi, H. S., . . . & Kim, S. K. (2013). Predictive value of 18 FDG PET-CT for tumour response in patients with locally advanced rectal cancer treated by preoperative chemoradiotherapy. International journal of colorectal disease, 28(9), 1217-1224.*
Tanner, L. N., Hughes, N. P., Brady, M., Anderson, M., & Gleeson, F. V. (2009, Jun.). Robust estimation of pharmacokinetic parameters in DCE-MRI analysis of rectal tumours. In Biomedical Imaging: From Nano to Macro, 2009. ISBI'09. IEEE International Symposium on (pp. 69-72). IEEE. (Year: 2009).*
Fan, X., Medved, M., Karczmar, G. S., Yang, C., Foxley, S., Arkani, S., . . . & Newstead, G. M. (2007). Diagnosis of suspicious breast lesions using an empirical mathematical model for dynamic contrast-enhanced MRI. Magnetic resonance imaging, 25(5), 593-603. (Year: 2007).*
El Khouli, R. H., Macura, K. J., Jacobs, M. A., Khalil, T. H., Kamel, I. R., Dwyer, A., & Bluemke, D. A. (2009). Dynamic contrast-enhanced MRI of the breast: quantitative method for kinetic curve type assessment. American Journal of Roentgenology, 193(4), W295-W300. (Year: 2009).*
Kim, J. W., Kim, H. C., Park, J. W., Park, S. C., Sohn, D. K., Choi, H. S., Kim, S. K. (2013). Predictive value of 18 FDG PET-CT for tumour response in patients with locally advanced rectal cancer treated by preoperative chemoradiotherapy. International journal of colorectal disease, 28(9), 1217-1224. (Year: 2013).*
International Search Report and the Written Opinion dated Mar. 10, 2015 From the International Searching Authority Re. Application No. PCT/IB2014/002592.
Fusco et al. "Use of Tracer Kinetic Models for Selection of Semi-Quantitative Features for DCE-MRI Data Classification", Applied Magnetic Resonance, XP055131485, 44(11): 1311-1324, Published Online Sep. 1, 2013.
Pickles et al. "Prognostic Value of Pre-Treatment DCE-MRI Parameters in Predicting Disease Free and Overall Survival for Breast Cancer Patients Undergoing Neoadjuvant Chemotherapy", European Journal of Rasiology, XP026586694, 71(3): 498-505, Sep. 1, 2009. Abstract.
Sansone et al. "A Study on Reference Based Time Intensity Curves Quantification in DCE-MRI Monitoring of Rectal Cancer", IFMBE Proceedings of the World Congress on Medical Physics and Biomedical Engineering, WC 2009, Munich, Germany, Sep. 7-12, 2009, XP009179368, 25/2: 38-41, Sep. 7, 2009. Abstract.

\* cited by examiner

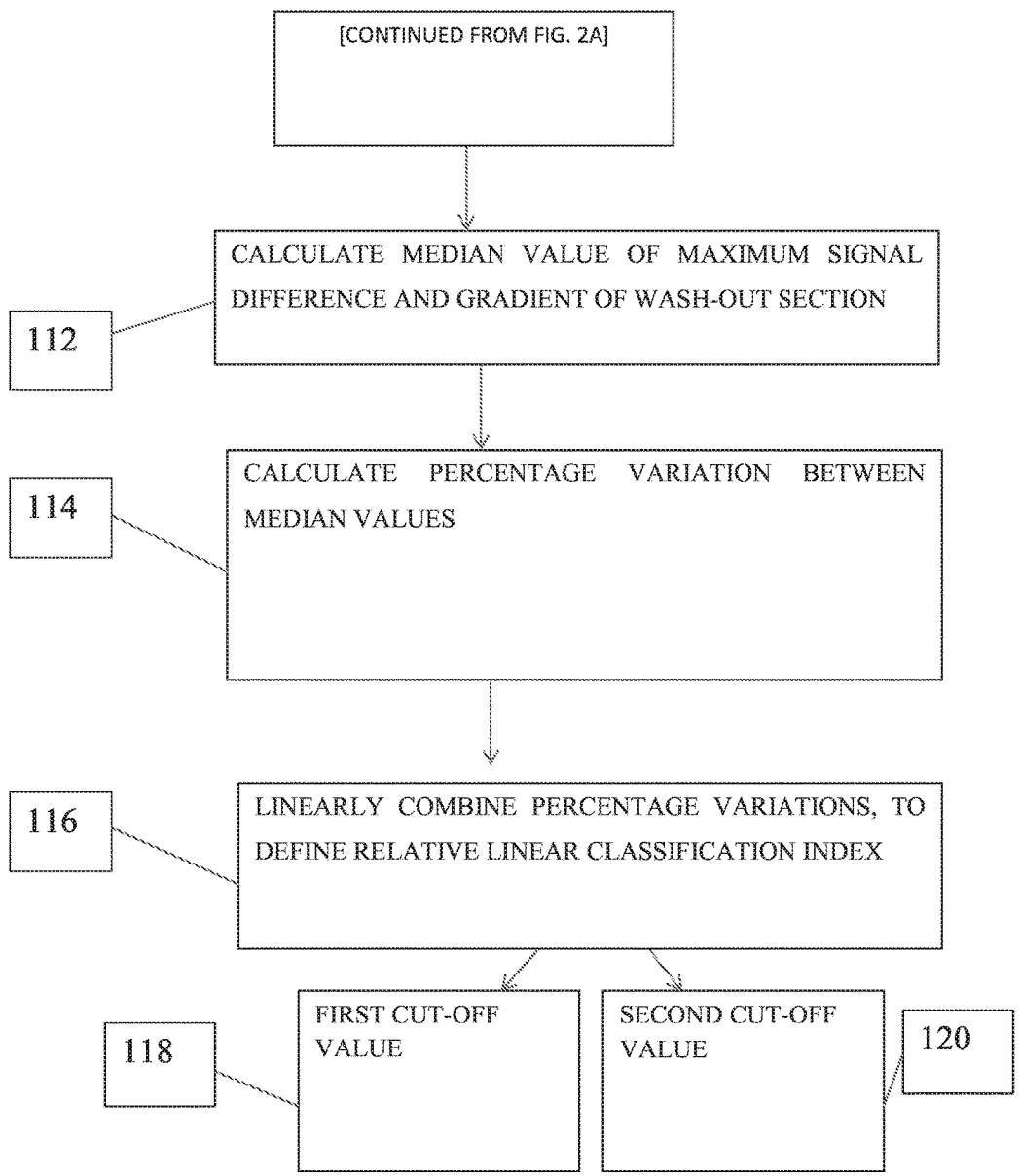

METHOD FOR ANALYZING DATA PROVIDED BY MAGNETIC RESONANCE IMAGING WITH DYNAMIC ADMINISTRATION OF CONTRAST MEDIUM

RELATED APPLICATIONS

This application is a National Phase of PCT Patent Application No. PCT/IB2014/002592 having International filing date of Nov. 28, 2014, which claims the benefit of priority of Italian Patent Application No. MO2013A000326 filed on Nov. 29, 2013. The contents of the above applications are all incorporated by reference as if fully set forth herein in their entirety.

FIELD AND BACKGROUND OF THE INVENTION

This invention relates to a method for analyzing data provided by Magnetic Resonance Imaging with dynamic administration of contrast medium (DCE-MRI) in patients with locally advanced rectal cancer, after neoadjuvant radio-chemotherapy. The DCE-MRI consists in acquiring a tumour volume before, during and after the administration of a contrast medium and in the subsequent assessment of the Time-Intensity curves (TIC), obtained as mean value over time of the grey level of a region of interest segmented by an expert radiologist.

Despite the efforts made to introduce and extend screening programs, rectal cancer is often fatal because it is diagnosed in a locally advanced stage of the illness.

The reduction of the tumour after neoadjuvant radio-chemotherapy (CRT) has been considered an important prognostic factor which involves the probability of a relapse and survival free of illness.

Nevertheless, a favourable answer to radio-chemotherapy treatment cannot always be associated with an appreciable reduction of tumour volume, including because it is often hard to distinguish between fibrosis and tumour residue.

Consequently, morphologic Magnetic Resonance Imaging is often not conclusive in discriminating between persons who fully respond to neoadjuvant CRT, persons who respond partially and persons who do not respond.

For this reason, currently, the tendency is to use DCE-MRI associated with a quality type approach of Time-Intensity curves.

In practice, for this type of approach, the operator visually assesses the pattern of the TIC obtained from the images provided by the DCE-MRI.

Although this method is potentially successful in detecting post-CRT tumour residues, it is by its nature subjective, inasmuch as it depends on the individual capacity and preparation of the person who "reads" the data provided by the DCE-MRI.

SUMMMARY OF THE INVENTION

The main object of the present invention is to provide a method of analysis of the data provided by the DCE-MRI performed on persons with locally advanced rectal cancer which permits very successfully discriminating the persons who fully respond to CRT, those who respond partially and those who do not respond.

Another object of the present invention is to provide a method of analysis of the data provided by the DCE-MRI performed on persons suffering from locally advanced rectal cancer undergoing neoadjuvant CRT which permits overcoming the above-mentioned drawbacks of prior art within the ambit of a simple, rational, easy, effective to use and affordable solution.

The above-mentioned objects are achieved by the present method of analysis of the data provided by Magnetic Resonance Imaging with dynamic administration of contrast medium in patients with locally advanced rectal cancer, after neoadjuvant radio-chemotherapy according to claim 1.

BRIEF DESCRIPTION OF THE DRAWINGS

Other characteristics and advantages of the present invention will become better evident from the description of a preferred but not exclusive embodiment of a method of analysis, illustrated by way of an indicative, but not limitative, example in the accompanying drawings wherein:

FIGS. 2a-b show a flowchart illustrating actions performed in accordance with embodiments of the invention.

DESRIPTION OF THE SPECIFIC EMBODIMENTS OF THE INVENTION

The method of the invention has been devised to conduct an analysis of the data provided by the DCE-MRI performed on patients with locally advanced rectal cancer.

In detail, the invention consists of a method of calculation which can be formalized in an algorithm and is implementable in a computer program.

The proposed method allows the operator to perform a semi-quantitative analysis of the DCE-MRI data, in order to discriminate between patients that respond completely to the neoadjuvant CRT, patients that respond partially and patients that do not respond.

Clearly, the assessment of the operator and his/her prognosis do not represent a subject of the invention.

Figure 2A:
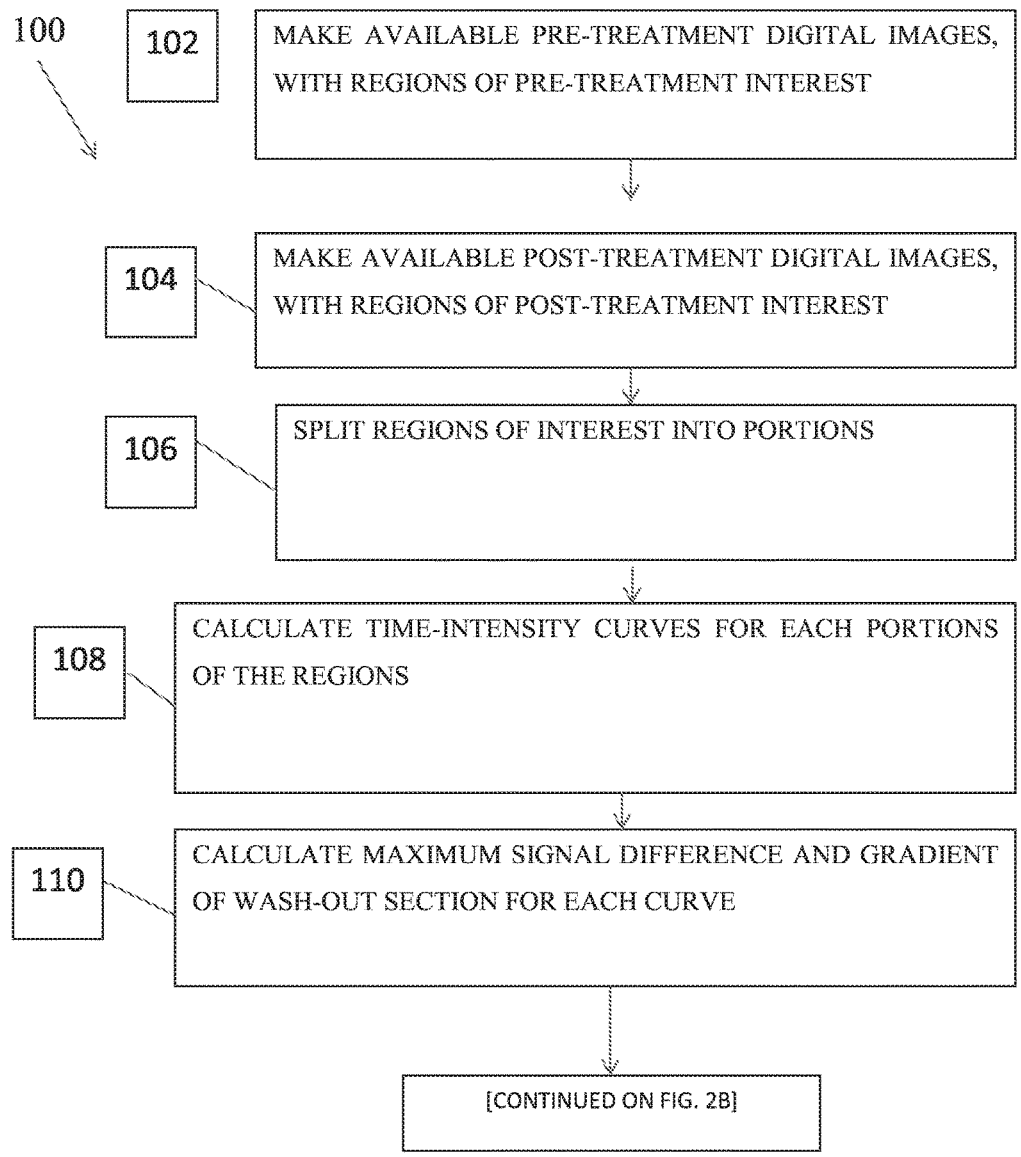

As shown in FIG. 2a, the method 100 first of all envisages making available pre-treatment digital images (102) relating to various moments before, during and after the administration of the contrast medium, produced by means of DCE-MRI conducted on the patient before he/she undergoes CRT. The contrast medium used is a gadolinium-based paramagnetic contrast.

In these pre-treatment images, one or more regions of interest are identified which define the outlines of the tumour.

The outlines can be traced "manually" by the operator using graphic processing programs or the like.

Furthermore, other post-treatment digital images are made available(104), produced by means of DCE-MRI, this time performed on the patient after he/she has undergone CRT, in which one or more regions of post-treatment interest are identified, which define the outlines of the tumour.

In practice, the identified regions of pre- and post-treatment interest detect the tumour volume of the patient before CRT and the tumour residue and/or necrosis/fibrosis after CRT. At this point, the method requires, at 106, splitting the regions of pre- and post-treatment interest identified into a plurality of portions such as, e.g., the pixels of the relative images, for each of which a first pre-treatment time-intensity curve and a second post-treatment time-intensity curve are calculated (108). By the term "intensity" used here in reference to the calculated curves, is meant the level of intensity of the colour (generally grey) of each identified portion, e.g., the level of intensity of each pixel, which is correlated to the absorption of the contrast medium in the corresponding tissue area and, therefore to tumour vascularization.

The method forming the subject of the present invention therefore provides for the obtaining of a plurality of first curves, relating to the portions into which the region of pre-treatment interest has been split, and of a plurality of second curves, relating to the portions into which the region of post-treatment interest has been split.

At 110, for each of the curves so obtained, two particular form descriptors are calculated which are the maximum signal difference and the gradient of the wash-out section respectively, the latter being notably the section of curve that represents the excretion phase of the contrast medium and which corresponds to the portion that starts at the point where the signal is strongest. A first plurality of values is thus obtained relating to the maximum signal difference and to the gradient of the wash-out section, corresponding to the number of first calculated curves, and a second plurality of values relating to the maximum signal difference and to the gradient of the wash-out section, corresponding to the number of second calculated curves.

After which, at 112, the median value is determined of the maximum signal difference and of the gradient of the wash-out section calculated for the first curves and the median value of the same form descriptors calculated for the second curves. This way a first median value is obtained of the maximum signal difference and of the gradient of the wash-out section relating to the pre-treatment region, and a second median value of the maximum signal difference and of the gradient of the wash-out section relating to the post-treatment region.

Subsequently, at 114, the percentage variation is determined between the median values thus calculated, i.e., the percentage variation between the median value of the maximum signal difference and of the gradient of the wash-out section calculated for the first curves and the median value of the maximum signal difference and of the gradient of the wash-out section calculated for the second curves, respectively.

Such percentage variations, i.e., the percentage variation of the maximum signal difference and the percentage variation of the gradient of the wash-out section, are linearly combined (116) to define a linear classification index to two parameters. In practice, the index is calculated using the following formula: $\alpha\Delta_{MSD}+\beta\Delta_{WOS}$, where $\Delta_{MSD}$ corresponds to the percentage variation of the maximum signal difference, $\Delta_{WOS}$ corresponds to the percentage variation of the gradient of the wash-out section, while $\alpha$ and $\beta$ are real numbers (the preferential values of which are discussed below).

It should be noted that the invention provides an index which is the combination of two parameters which are both able to be used by the operator to discriminate patient response to CRT treatment.

In detail, both the percentage parameters are based on form descriptors of the time-intensity curves which reflect the degree of angiogenesis of the considered regions of interest, which is notably an extremely reliable indicator of the formation of neoplastic tissue or, as in this case, of its remission.

As parameters of the linear combination, the Applicant has chosen the variation in the maximum signal difference and the variation in the gradient of the wash-out section following clinical studies wherein the considered patients underwent CRT and subsequent mesorectal resection for the histopathological control of tumour presence.

The check-up was performed by assessing the resection margins of the taken samples, according to procedures known and well-tested in literature, and the results were classified according to the degree of tumour regression (TRG).

During the study, the variations in other form descriptors were also taken into consideration.

Taking into account the results of the check-up of the presence of tumours, a statistical analysis was performed which also involved the calculation of the ROC (Receiver Operating Characteristic) curves of the possible linear combinations in the variations of the different descriptors and, for each curve, the underlying surface area or AUROC (area under ROC) was calculated.

The linear combination between the percentage variations in the signal difference and in the gradient of the wash-out section is that characterized by the AUROC of larger size and was therefore considered the most effective to be used as index of discrimination between respondent and non-respondent patients.

It should be noticed that the combination of the two parameters is a surprisingly synergic result inasmuch as it is true to say that each of them, taken individually, could be a plausible discrimination index, but it has been determined that, in this case, there would be a statistical overlap between persons classified as respondent and those classified as non-respondent, leading to potential false positives or negatives.

The linear combination of the two parameters on the other hand has optimized sensitivity, sensibility and therefore accuracy.

In general, $\alpha$ and $\beta$ can be included between 0.5 and 1.

Figure 1:
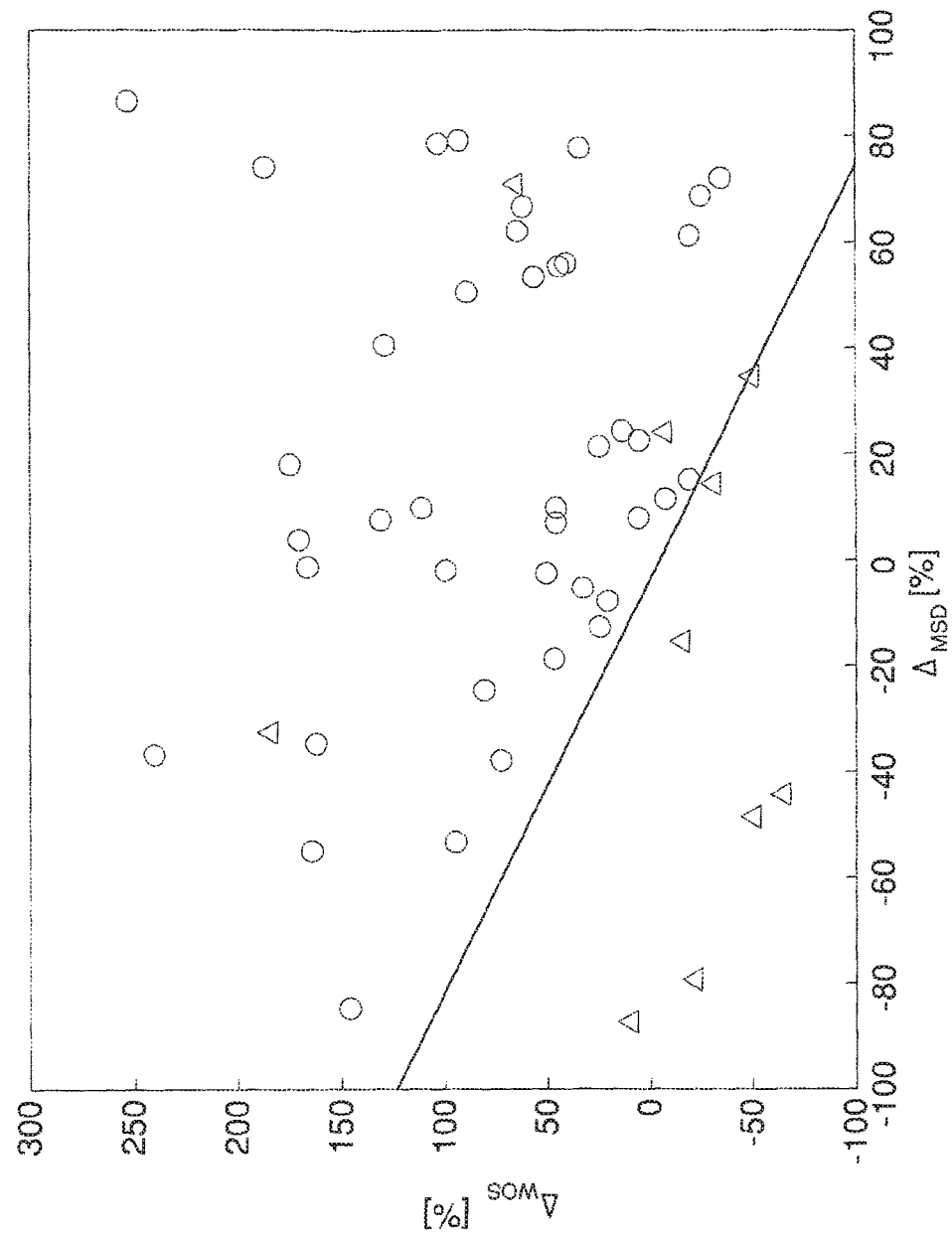
FIG. 1 is a graph which shows experimental data to support the efficacy of the method of the invention, where the respondent patients have been represented with a circle and those non-respondent with a triangle.

Preferably, $\alpha$ is chosen equal to 0.778 and $\beta$ is chosen equal to 0.6157 because the linear combination thus defined leads to an index that maximizes the AUROC and which in this case can be called Standardized Index of Shape (SIS) (see FIG. 1).

A first cut-off value (118) of the Standardized Index of Shape, below which the patients will be considered as non-respondent, is preferably included between−2% and−4%. More in particular, the first cut-off value is equal to−3%. The patients with a SIS value above−3% will be considered responsive to therapy.

A second SIS cut-off value (120), beyond which the patients will be considered completely responsive to therapy is between 40% and 60%.

Preferably, the second SIS cut-off value is equal to 50%.

In any case, the operator's clinical assessments are unrelated to the subject of the present patent.

The FIG. 1 clearly shows how the respondent persons taking part in the experiment have high SIS values.

It has in practice been ascertained how the described invention achieves the proposed objects and in particular the fact is underlined that the linear classification index obtained using the method forming the subject of the present invention permits successfully assessing the response of patients undergoing CRT.

What is claimed is:
1. Method for the analysis of data provided by Magnetic Resonance Imaging with dynamic administration of a contrast medium, called DCE-MRI, in patients suffering from locally advanced rectal cancer, after neoadjuvant radio-chemotherapy treatment, comprising the phases of:
    making available pre-treatment digital images obtained by means of said DCE-MRI performed on the patient before he/she undergoes radio-chemotherapy treatment, wherein in each pre-treatment digital image there are identified one or more regions of pre-treatment interest, which identify the outlines of the tumour, the outlines being traced by an operator;

making available post-treatment digital images obtained by means of said DCE-MRI performed on the patient after he/she has undergone radio-chemotherapy treatment, wherein in each post-treatment digital image there are identified one or more regions of post-treatment interest, which identify the outlines of the residual tumour;

splitting said regions of pre- and post-treatment interest into a plurality of portions;

calculating a first set of time-intensity curves for each of said portions of the regions of pre-treatment interest and a second set of time-intensity curves for each of said portions of the regions of post-treatment interest;

calculating the maximum signal difference and the gradient of the wash-out section for each of said first and said second curves so calculated, the gradient of the wash-out section being the section of curve that represents the excretion phase of the contrast medium and that corresponds to the portion which starts at the point where the signal is strongest;

for each digital image, calculating the median value of the maximum signal difference and of the gradient of the wash-out section calculated for said first and for said second curves;

for each set of curves, calculating the percentage variation between the median values of the maximum signal difference and the median values of the gradient of the wash-out section calculated for said first set of curves, and between the median values of the maximum signal difference and the median values of the gradient of the wash-out section calculated for said second set of curves;

across multiple digital images, linearly combining said percentage variation between the median values of the maximum signal difference and said percentage variation between the median values of the gradient of the wash-out section, to define a relative linear classification index;

wherein said relative linear classification index is calculated with the following formula $\alpha\Delta_{MSD}+\beta\Delta_{WOS}$, where $\Delta_{MSD}$ corresponds to said percentage variation of the maximum signal difference, $\Delta_{WOS}$ corresponds to said percentage variation of the gradient of the wash-out section, $\alpha$ is a number between 0.5 and 1 and $\beta$ is a number between 0.5 and 1 and wherein a first cut-off value of said relative linear classification index is between −2% and −4%.

2. Method according to claim 1, wherein $\alpha$ is 0.778.

3. Method according to claim 1, wherein $\beta$ is 0.6157.

4. Method according to claim 1, wherein said first cut-off value is −3%.

5. Method according to claim 1, wherein a second cut-off value of said relative linear classification index is between 40% and 60%.

6. Method according to claim 5, wherein said second cut-off value is 50%.

7. Method according to claim 1, wherein said portions of the regions of pre- and post-treatment interest correspond to each pixel of the regions themselves.

* * * * *